US006273747B1

(12) United States Patent
Helfrich

(10) Patent No.: US 6,273,747 B1
(45) Date of Patent: Aug. 14, 2001

(54) CONNECTOR FOR A FLAT FLEXIBLE CABLE

(75) Inventor: Ludwig Helfrich, Plattling (DE)

(73) Assignee: Siemens Aktiengesellschaft (DE)

( * ) Notice: Subject to any disclaimer, the term of this patent is extended or adjusted under 35 U.S.C. 154(b) by 0 days.

(21) Appl. No.: 09/655,301

(22) Filed: Sep. 5, 2000

(30) Foreign Application Priority Data

Sep. 2, 1999 (DE) .............................................. 199 41 845

(51) Int. Cl.[7] ............................. H01R 3/00; H01R 12/00; H05K 1/00

(52) U.S. Cl. ............................................... 439/489; 439/67

(58) Field of Search .............................. 439/489, 67, 493, 439/490

(56) References Cited

U.S. PATENT DOCUMENTS 4,808,911 * 2/1989 Oaks .................................. 324/57 Q
4,975,068 * 12/1990 Squires .................................. 439/67

* cited by examiner

*Primary Examiner*—Tulsidas Patel
*Assistant Examiner*—Chandrika Prasad

(57) ABSTRACT

A connector for a flat flexible cable includes a set of first contacts on a connector body. A set of second contacts on a catch cooperatively mates with the set of first contacts. The second contacts are electrically interconnected via a link. Thus, it is possible to check that the catch is in the correct position on the connector body, and to check the electrical contact between electrical conductors of the flat flexible cable and contact pins of the connector body.

17 Claims, 2 Drawing Sheets

CONNECTOR FOR A FLAT FLEXIBLE CABLE

CROSS REFERENCE TO RELATED APPLICATIONS

This application claims the benefit of priority based on German Patent Application No. 19941845.4, filed Sep. 2, 1999, the disclosure of which is incorporated by reference herein in its entirety.

BACKGROUND OF THE INVENTION

The claimed invention relates to a connector in which a flat flexible cable (FFC) is fixed between a connector body and a catch. The claimed invention also relates to a method for checking electrical contact between conductors in the FFC and contact pins on the connector body.

Conventional FFC connectors clamp the cable between a connector body and a catch. These conventional FFC connectors can be produced cheaply and allow compact connector dimensions for a large number of contact pins. The process of using these conventional FFC includes clamping the flat cable such that mechanical fixing and electrical contact between the conductors of the cable and the contact pins of the connector are achieved concurrently. For this process, the contact pins normally have contact surfaces that produce the contact with the conductors of the flat cable. However, when fitting conventional FFC connectors to a flat cable, it is possible for faults to occur if the cable is not clamped sufficiently firmly in the connector, or if the conductors in the cable are slightly misaligned with respect to the contact surfaces. This is particular disadvantageous in automotive applications in which good resistance to vibration is required.

An example of such a conventional FFC connector is disclosed in German Patent Specification No. 196 09 522 C2. A plug connection between a connector and a mating connector includes an additional lock in order to prevent it from being released inadvertently. Another example is disclosed in German Laid-Open Specification No. 44 41 137 A1. A connection having a connector and a mating connector includes a short-circuiting contact element with elastic contact pieces that make it possible to detect whether contact has been made correctly. However, only correct joining of the connector and mating connector is ensured with these connectors. There is no assurance that the conductors in a cable make contact with the contact pins in the connector or the mating connector.

German Laid-Open Specification No. 25 37 421 A1 discloses a connector for flat cables that aligns the individual parts of the connector with respect to one another and simplifies the insertion of the flat cable. The connector has a connector body through which the contact pins pass, a bearing surface on which the flat cable makes electrical contact with the contact pins, and a catch that makes electrical contact with the flat cable.

German Laid-Open Specification No. 38 38 657 A1 discloses a plug connector in which two contacts are arranged on one connector half and two mating contacts are arranged on the other connector half. A short-circuiting link connects the two mating contacts, so that the connector can be monitored for inadvertent disconnection.

It is known from the abstract for Japanese Application No. 6-231834 A that a plurality of contact elements, i.e., contact pins and contact sockets, in a plug connector can be used to check the contact status. Pairs of contact elements on each side of the connector are connected to one another in such a way that a closed monitoring circuit is formed when the connector is joined.

It is also known from the abstract for Japanese Application No. 11296262 A that an arrangement for a printed circuit connector can include two contacts located on the connector and two short-circuited mating contacts located on the printed circuit. This arrangement can be used to check the status of the contact between the printed circuit and the connector.

SUMMARY OF THE INVENTION

The claimed invention provides a connector for a flat flexible cable, e.g., a data cable, and a method for checking the electrical contact between the connector and the flat flexible cable. Moreover, the electrical contact between the conductors in the flat flexible cable and contact pins in the connector can be checked reliably and easily.

The claimed invention provides a connector for a flat flexible cable having a plurality of electrical conductors electrically isolated from one another by an insulating jacket. The connector comprises body having a surface adapted for contiguously engaging the flat flexible cable; at least one pin extending through the body, each at least one pin adapted for electrically contacting a respective one of the plurality of electrical conductors; a set of first contacts arranged on the surface, each one of the first contacts being electrically interconnected with a respective pin; a catch cooperatively engaging the body and adapted for mechanically fixing the flat flexible cable against the surface; a set of second contacts arranged on the catch, each one of the second contacts cooperatively mating with a respective one of the first contacts; and a link electrically interconnecting the second contacts.

The claimed invention also provides an electrical connection system that comprises a flexible cable extending between first and second ends, the flexible cable having a plurality of electrical conductors electrically isolated from one another by an insulating jacket; a first connector at the first end of the flexible cable, and a second connector at the second end of the flexible cable. The first connector includes a first body having a first surface contiguously engaging the first end of the flexible cable; a set of first pins extending through the first body, each one of the first pins electrically contacting a respective one of the plurality of electrical conductors; a set of first contacts arranged on the first surface, each one of the first contacts being electrically interconnected with a respective first pin; a first catch cooperatively engaging the first body and mechanically fixing the first end of the flexible cable against the first surface; a set of second contacts arranged on the first catch, each one of the second contacts cooperatively mating with a respective one of the first contacts; and a first link electrically interconnecting the second contacts. The second connector includes a second body having a second surface contiguously engaging the second end of the flexible cable; a set of second pins extending through the second body, each one of the second pins electrically contacting a respective one of the plurality of electrical conductors; a set of third contacts arranged on the second surface, each one of the third contacts being electrically interconnected with a respective second pin; a second catch cooperatively engaging the second body and mechanically fixing the second end of the flexible cable against the second surface; a set of fourth contacts arranged on the second catch, each one of the fourth contacts cooperatively mating with a respective one of the third contacts; and a second link electrically interconnecting the fourth contacts.

The claimed invention further provides a method for testing an electrical connection system. The method comprises providing a flexible cable extending between first and second ends, the flexible cable having a plurality of electrical conductors electrically isolated from one another by an insulating jacket; providing a first connector at the first end of the flexible cable, providing a second connector at the second end of the flexible cable, providing a measuring device electrically interconnecting a first contact and its respective first pin; applying an electrical signal with the measuring device; and determining an existence of an electrical loop. The first connector includes a first body having a first surface contiguously engaging the first end of the flexible cable; a set of first pins extending through the first body, each one of the first pins electrically contacting a respective one of the plurality of electrical conductors; a set of first contacts arranged on the first surface, each one of the first contacts being electrically interconnected with a respective first pin; a first catch cooperatively engaging the first body and mechanically fixing the first end of the flexible cable against the first surface; a set of second contacts arranged on the first catch, each one of the second contacts cooperatively mating with a respective one of the first contacts; and a first link electrically interconnecting the second contacts. The second connector includes a second body having a second surface contiguously engaging the second end of the flexible cable; a set of second pins extending through the second body, each one of the second pins electrically contacting a respective one of the plurality of electrical conductors; a set of third contacts arranged on the second surface, each one of the third contacts being electrically interconnected with a respective second pin; a second catch cooperatively engaging the second body and mechanically fixing the second end of the flexible cable against the second surface; a set of fourth contacts arranged on the second catch, each one of the fourth contacts cooperatively mating with a respective one of the third contacts; and a second link electrically interconnecting the fourth contacts. The electrical loop includes the first contacts, the second contacts, the third contacts, the fourth contacts, the first link, the second link, the respective ones of the first pins, the respective ones of the second pins, the respective ones of the plurality of electrical conductors, and the measuring device.

The cable can, for example, be a flexible printed circuit, a flat cable, or a flat ribbon cable.

The mating contacts can be connected to one another by a short-circuiting link that makes it possible to reliably determine whether the catch is pressing, to a sufficient extent, the flat flexible cable against the contact-making surface and the contact pins.

The contacts can also be used as a guide for the flat flexible cable, thereby ensuring that the conductors in the cable are positioned correctly with respect to the contact pins.

BRIEF DESCRIPTION OF THE DRAWINGS

The accompanying drawings, which are incorporated herein and constitute part of this specification, illustrate presently preferred embodiments of the invention and, together with the general description given above and the detailed description given below, serve to explain features of the invention.

DETAILED DESCRIPTION OF THE PREFERRED EMBODIMENTS

Figure 1:
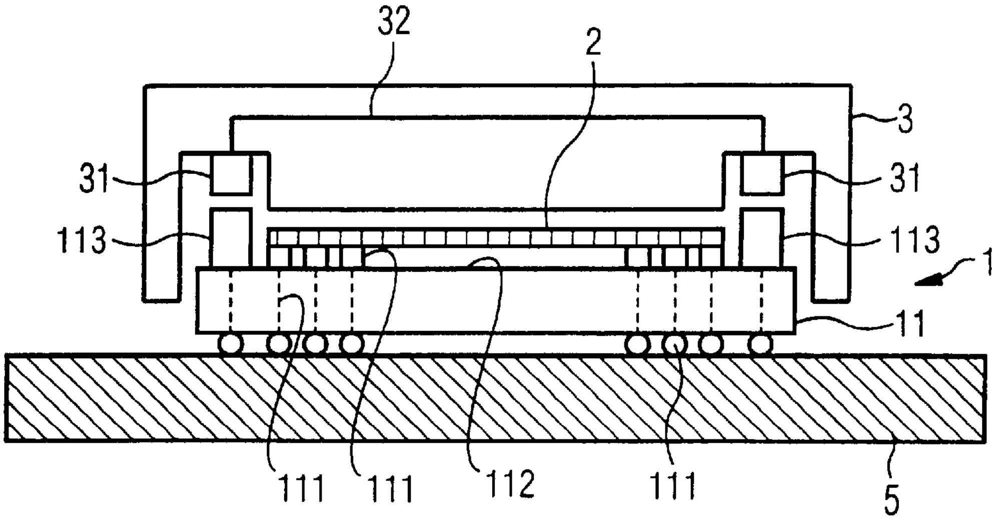
FIG. 1 shows a front view of a connector.

FIG. 1 shows a connector 1 having a connector body 11. A set of contact pins 111 passes through the connector body 11. As is it is used in connection with the claimed invention, the term "set" refers to at least one example. On one side of the connector body 11, the contact pins 111 are received in plug openings (not shown) in a printed circuit 5. On the opposite side, the contact pins 111 project above a bearing surface or a contact-making region 112. A flat flexible cable 2 is placed on this contact-making region 112. The cable 2 can be a data cable in the form of a flat cable or a flat ribbon cable. During the fitting process, this cable is pressed by a bracket or catch 3 against the contact pins 111 in such a way that the contact pins 111 cut through an insulating jacket, e.g., an electrically isolating plastic material, of the cable 2, and make contact with the electrical conductors of the cable 2.

A metallic contact 113 is arranged on each side of the cable 2. The contacts 113 project above the contact-making region 112 so that they can act as guides for the cable 2. A metallic mating contact 31 on the catch 3 is associated with each of the contacts 113. The two mating contacts 31 are electrically connected to one another by means of a short-circuiting link 32. The short-circuiting link 32 is completely embedded in an electrically isolating, e.g., plastic, material of the catch 3.

When the cable 2 is clamped in the connector 1, the catch 3 is pressed against the connector body 11 until the contacts 113 and the mating contacts 31 touch one another. The contacts 113 and mating contacts 31 form stops, which define the final position of the catch 3 with respect to the connector body 11. In this final position, the catch 3 can be latched on the connecting body 11. When the contacts 113 and the mating contacts 31 abut against one another, the conductors in the cable 2 make reliable contact with the contact pins 111 in the connector body 11.

Figure 2:
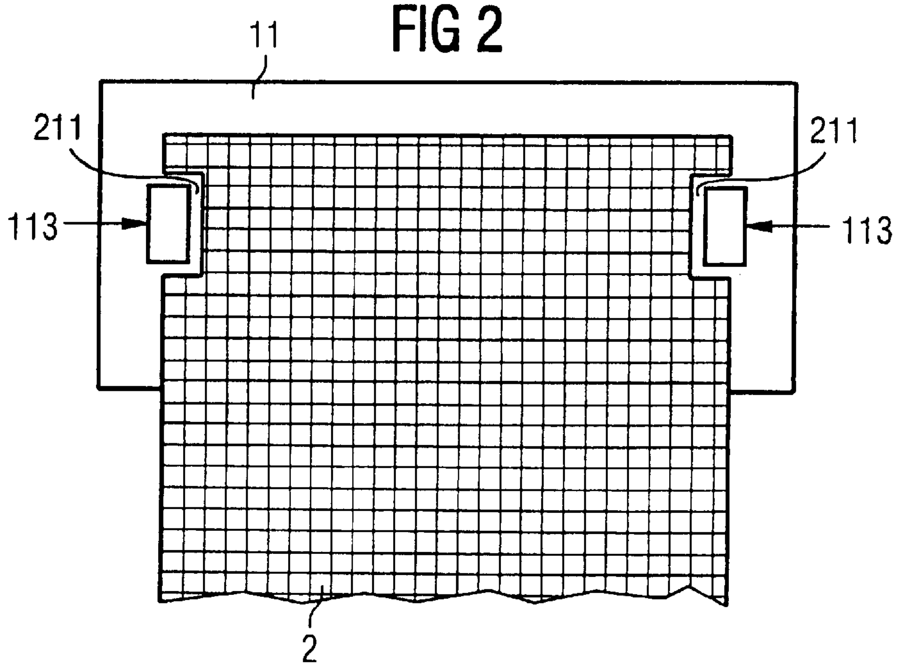
FIG. 2 shows a plan view of a connector body.

FIG. 2 shows that the cable 2 can have recesses 211 in the form of grooves in the region of the contacts 113. The contacts 113 engage in the recesses 211 so that the cable 2 is positioned in a predefined position before contact is made between the conductors of the cable 2 and the contact pins 111. The shape of a recess 211 substantially matches the dimensions of the corresponding contact 113.

Additionally, a unique mating arrangement to ensure that the cable 2 is not reversed can be provided if the recesses 211 and contacts are arranged in an asymmetric pattern. Alternatively or in addition, the recesses 211 and the contacts 113 can have different dimensions that must be matched. For example, the grooves or recesses 211 may have different widths or depths.

Figure 3:
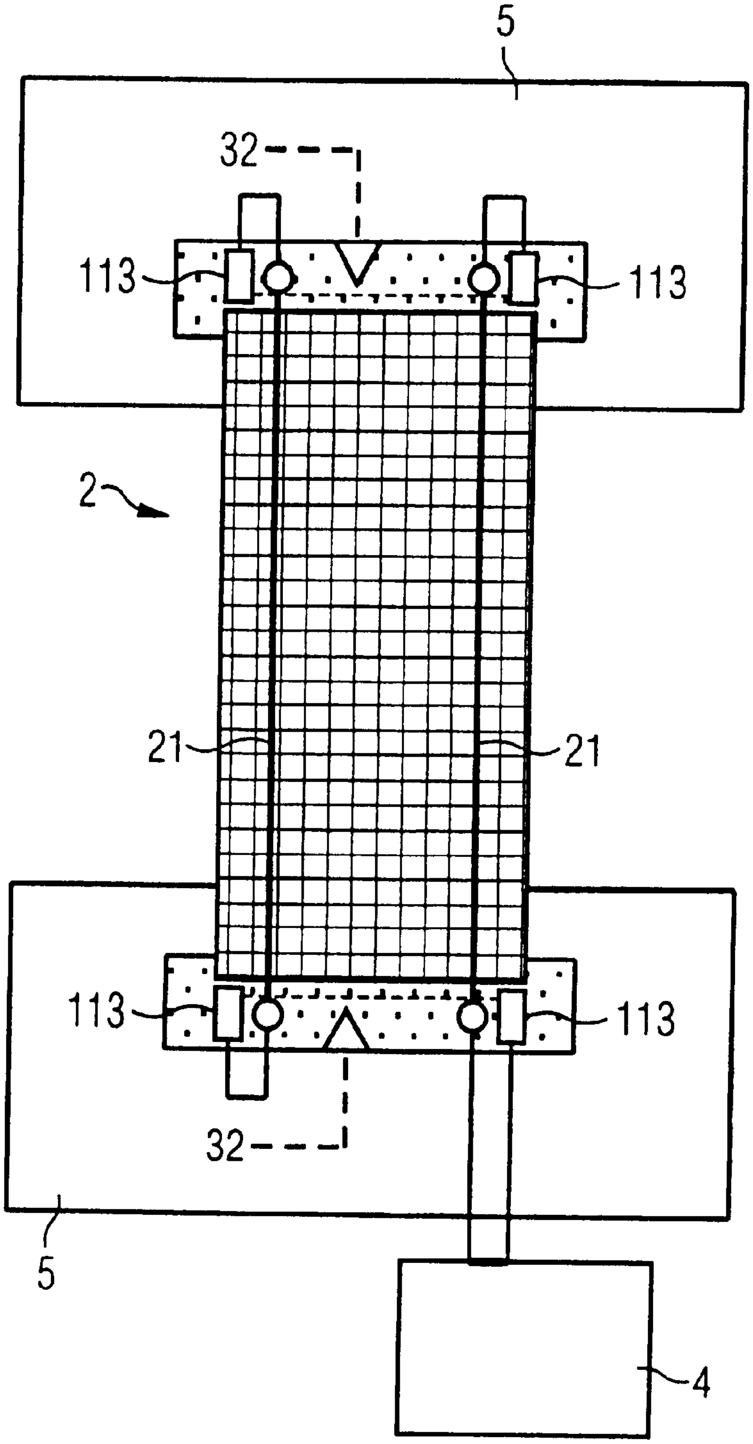
FIG. 3 shows an electrical connection system that is being checked.

FIG. 3 shows a cable 2 in the form of an FFC cable. The cable 2 is provided with an FFC connector 1 at both ends. The two connectors 1 are plugged onto connecting blocks (not shown) located on respective printed circuits 5. Each one of the contacts 113 are electrically interconnected to a respective contact pin 111, which, when the connector 1 is fitted, make contact with an electrical conductor 21 of the cable 2.

One contact 113 is connected via a measuring device 4 to a contact pin 111. The measuring device 4 can be a micro controller. When all the mating contacts 31 are positioned on the contacts 113, so that there is an electrical connection between respective contacts 113 and mating contacts 31, an electrical loop is formed via the short-circuiting links 32 of the catch 3 (not shown in FIG. 3). If, on the other hand, the catch 3 was not correctly positioned and fitted position (because, for example, the cable 2 is clamped between a contact 113 and a mating contact 31), then the electrical loop is broken. This is also true if the cable 2 is misaligned with respect to the contact pins 111. By evaluating the loop resistance, the measuring device 4 can check that the connector 1 has been fitted and positioned correctly with respect to the cable 2.

This check can be carried out immediately after the cable 2 has been fitted in the connector 1. Alternatively, the measuring device 4 can be integrated in an electronic appliance that communicates with the connector 1. This is particularly worthwhile for safety-relevant applications such as an automotive airbag controller.

While the invention has been disclosed with reference to certain preferred embodiments, numerous modifications, alterations, and changes to the described embodiments are possible without departing from the sphere and scope of the invention, as defined in the appended claims and their equivalents thereof. Accordingly, it is intended that the invention not be limited to the described embodiments, but that it have the full scope defined by the language of the following claims.

What is claimed is:

1. A connector for a flat flexible cable having a plurality of electrical conductors electrically isolated from one another by an insulating jacket, the connector comprising:

- a body having a surface contiguously engaging the flat flexible cable;
- at least one pin extending through the body, each at least one pin electrically contacting a respective one of the plurality of electrical conductors;
- a set of first contacts arranged on the surface, each one of the first contacts being electrically interconnected with a respective pin;
- a catch cooperatively engaging the body and mechanically fixing the flat flexible cable against the surface;
- a set of second contacts arranged on the catch, each one of the second contacts cooperatively mating with a respective one of the first contacts; and
- a link electrically interconnecting the second contacts and making an electrical connection with the respective one of the first contacts.

2. The connector according to claim 1, wherein the sets of first and second contacts cooperatively mate only when the surface contiguously engages the flat flexible cable, and only when each pin electrically contacts its respective electrical conductor.

3. The connector according to claim 1, wherein the catch encases and electrically insulates the link.

4. The connector according to claim 1, wherein the first contacts are arranged on the surface in a pattern adapted to matingly engage the flat flexible cable.

5. The connector according to claim 4, wherein each one of the first contacts project above the surface and is received in a corresponding recess in the flat flexible cable.

6. The connector according to claim 4, wherein the pattern uniquely engages the flat flexible cable.

7. The connector according to claim 1, wherein the first set consists of a first pair of contacts, and wherein the second set consists of a second pair of contacts.

8. The connector according to claim 1, wherein the at least one pin is electrically conductive, and the connector body is electrically insulative.

9. The connector according to claim 1, wherein the at least one pin projects above the surface, and the at least one pin penetrates the insulating jacket.

10. An electrical connection system, comprising:

- a flexible cable extending between first and second ends, the flexible cable having a plurality of electrical conductors electrically isolated from one another by an insulating jacket;
- a first connector at the first end of the flexible cable, the first connector including:
  - a first body having a first surface contiguously engaging the first end of the flexible cable;
  - a set of first pins extending through the first body, each one of the first pins electrically contacting a respective one of the plurality of electrical conductors;
  - a set of first contacts arranged on the first surface, each one of the first contacts being electrically interconnected with a respective first pin;
  - a first catch cooperatively engaging the first body and mechanically fixing the first end of the flexible cable against the first surface;
  - a set of second contacts arranged on the first catch, each one of the second contacts cooperatively mating with a respective one of the first contacts; and
  - a first link electrically interconnecting the second contacts and making an electrical connection with the respective one of the first contacts; and
- a second connector at the second end of the flexible cable, the second connector including:
  - a second body having a second surface contiguously engaging the second end of the flexible cable;
  - a set of second pins extending through the second body, each one of the second pins electrically contacting a respective one of the plurality of electrical conductors;
  - a set of third contacts arranged on the second surface, each one of the third contacts being electrically interconnected with a respective second pin;
  - a second catch cooperatively engaging the second body and mechanically fixing the second end of the flexible cable against the second surface;
  - a set of fourth contacts arranged on the second catch, each one of the fourth contacts cooperatively mating with a respective one of the third contacts; and
  - a second link electrically interconnecting the fourth contacts.

11. The electrical connection system according to claim 10, wherein the flexible cable includes one of a flat cable and a flexible printed circuit.

12. The electrical connection system according to claim 10, wherein the first and second connectors are flat flexible cable connectors.

13. The electrical connection system according to claim 10, wherein the first and third contacts project above the first and second surfaces, respectively, and are received in corresponding recesses in the first and second ends, respectively, of the flexible cable.

14. The electrical connection system according to claim 13, wherein the first and third contacts are arranged on the first and second surfaces, respectively, in first and second patterns, respectively, that uniquely engage the first and second ends, respectively, of the flexible cable.

15. The electrical connection system according to claim 10, further comprising:

a measuring device electrically interconnecting one of the first contacts and its respective first pin;

wherein an electrical loop includes the first contacts, the second contacts, the third contacts, the fourth contacts, the first link, the second link, the respective ones of the first pins, the respective ones of the second pins, the respective ones of the plurality of electrical conductors, and the measuring device.

16. A method for testing an electrical connection system, the method comprising:

providing a flexible cable extending between first and second ends, the flexible cable having a plurality of electrical conductors electrically isolated from one another by an insulating jacket;

providing a first connector at the first end of the flexible cable, the first connector including:

a first body having a first surface contiguously engaging the first end of the flexible cable;

a set of first pins extending through the first body, each one of the first pins electrically contacting a respective one of the plurality of electrical conductors;

a set of first contacts arranged on the first surface, each one of the first contacts being electrically interconnected with a respective first pin;

a first catch cooperatively engaging the first body and mechanically fixing the first end of the flexible cable against the first surface;

a set of second contacts arranged on the first catch, each one of the second contacts cooperatively mating with a respective one of the first contacts; and a first link electrically interconnecting the second contacts; and providing a second connector at the second end of the flexible cable, the second connector including:

a second body having a second surface contiguously engaging the second end of the flexible cable;

a set of second pins extending through the second body, each one of the second pins electrically contacting a respective one of the plurality of electrical conductors;

a set of third contacts arranged on the second surface, each one of the third contacts being electrically interconnected with a respective second pin;

a second catch cooperatively engaging the second body and mechanically fixing the second end of the flexible cable against the second surface;

a set of fourth contacts arranged on the second catch, each one of the fourth contacts cooperatively mating with a respective one of the third contacts; and a second link electrically interconnecting the fourth contacts;

providing a measuring device electrically interconnecting one of the first contacts and its respective first pin;

applying an electrical signal with the measuring device; and determining an existence of an electrical loop including the first contacts, the second contacts, the third contacts, the fourth contacts, the first link, the second link, the respective ones of the first pins, the respective ones of the second pins, the respective ones of the plurality of electrical conductors, and the measuring device.

17. The method according to claim 16, wherein the determining the existence of the electrical loop includes measuring an electrical resistance of the electrical loop with the measuring device.

* * * * *